(12) United States Patent
Yu et al.

(10) Patent No.: US 8,076,686 B2
(45) Date of Patent: Dec. 13, 2011

(54) LIGHT EMITTING DIODE AND MANUFACTURING METHOD THEREOF

(75) Inventors: Kuo-Hui Yu, Hsinchu (TW); Yu-Cheng Yang, Hsinchu (TW); An-Ru Lin, Hsinchu (TW); Tsun-Kai Ko, Hsinchu (TW); Wei-Shou Chen, Hsinchu (TW); Yi-Wen Ku, Hsinchu (TW); Cheng-Ta Kuo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 575 days.

(21) Appl. No.: 12/073,736

(22) Filed: Mar. 10, 2008

(65) Prior Publication Data
US 2009/0224272 A1  Sep. 10, 2009

(30) Foreign Application Priority Data

Mar. 29, 2007  (CN) .......................... 2007 1 0091713

(51) Int. Cl.
*H01L 33/00* (2010.01)
(52) U.S. Cl. ............... 257/98; 257/79; 257/E21.001; 257/E33.001; 257/E33.005; 257/E33.06; 257/E33.062; 257/E33.072; 257/E33.073; 438/29; 438/69; 438/72; 438/74
(58) Field of Classification Search .............. 257/79, 257/98, E21.001, E33.001, E33.005, E33.06, 257/E33.062, E33.072, E33.073; 438/29, 438/48, 69, 72, 74
See application file for complete search history.

(56) References Cited

U.S. PATENT DOCUMENTS

| | | | |
|---|---|---|---|
| 6,809,341 B2 * | 10/2004 | Hsu et al. ...................... | 257/79 |
| 2003/0164503 A1 * | 9/2003 | Chen .............................. | 257/79 |
| 2004/0142824 A1 * | 7/2004 | Numssen et al. ............ | 505/470 |
| 2004/0217362 A1 | 11/2004 | Slater, Jr. et al. | |
| 2006/0001032 A1 * | 1/2006 | Murofushi et al. ............ | 257/79 |
| 2007/0020788 A1 | 1/2007 | Liu et al. | |
| 2008/0142825 A1 * | 6/2008 | Chen et al. ..................... | 257/98 |
| 2009/0032830 A1 * | 2/2009 | Li ................................... | 257/98 |

FOREIGN PATENT DOCUMENTS

| | | |
|---|---|---|
| CN | 1851947 | 10/2006 |
| JP | 10214991 | 8/1998 |
| TW | 230473 | 4/2005 |
| TW | 282183 | 6/2007 |

* cited by examiner

*Primary Examiner* — Lynne Gurley
*Assistant Examiner* — Meiya Li
(74) *Attorney, Agent, or Firm* — Bacon & Thomas, PLLC

(57) ABSTRACT

A light-emitting diode and the manufacturing method thereof are disclosed. The manufacturing method includes the steps of: sequentially forming a bonding layer, a geometric pattern layer, a reflection layer, an epitaxial structure and a first electrode on a permanent substrate, wherein the geometric pattern layer has a periodic structure; and forming a second electrode on one side of the permanent substrate.

6 Claims, 5 Drawing Sheets

LIGHT EMITTING DIODE AND MANUFACTURING METHOD THEREOF

TECHNICAL FIELD

This invention relates to a structure of a light emitting diode and a manufacturing method thereof, and more particularly, to a light emitting diode with a geometric pattern layer.

BACKGROUND

A light emitting diode (LED) is composed of an epitaxial structure such as a homo-structure, a single hetero-structure, a double hetero-structure, or a multiple quantum well. The LED with a p-n junction that can emit light with various wavelengths has several beneficial characteristics, including low electrical power consumption, low heat generation, long lifetime, small volume, good impact resistance, fast response and excellent stability. These characteristics have made the LED to be a light source applied into electrical appliances and electronic devices.

Typically, an LED is composed of an epitaxial structure with a substrate, an n-type cladding layer formed on the substrate, a p-type cladding layer and an active layer formed between the n-type cladding layer and the p-type cladding layer. Light is emitted as current flows through the active layer. The light wavelength can be altered by varying the composition of the epitaxial structure material.

In general, the light output of an LED depends on the quantum efficiency of the active layer and the light extraction efficiency. The higher the quantum efficiency of the active layer, the higher the light output of the light-emitting diode. Generally, improving the quality of epitaxial structure and the structural design of the active layer increases the quantum efficiency of the active layer. In addition, as the light extraction efficiency increases, the light output of the light-emitting diode is enhanced. In order to improve the light extraction efficiency, efforts are made to overcome the significant photon loss resulting from total reflection inside the light-emitting diode after emission from the active layer.

Currently, a common method for increasing the light output of light-emitting diode devices is to increase the light extraction efficiency of the light-emitting diodes. The methods for increasing the light extraction efficiency of light-emitting diodes substantially includes several methods described as following. The first method is to roughen the surface of the light-emitting diode by directly etching the surface of the light-emitting diode, so as to achieve the effect of increasing the light extraction efficiency of the light-emitting diode. In the method of roughening the surface of the light-emitting diode, a mask protects the local region of the surface, and wet etching or dry etching is applied to roughen the surface. However, in this conventional method for roughening the surface, the uniformity of the roughened surface is poor. The second method is to change the shape of the light-emitting diode by etching. However, the process of the second method is more complicated, so that the process yield is low.

SUMMARY

Therefore, an aspect of the present invention is to provide a light emitting diode to increase the light extraction efficiency and raise the light emitting efficiency thereof.

According to an embodiment of the present invention, the light emitting diode comprises a permanent substrate, a bonding layer, a geometric pattern layer, a reflection layer, an epitaxial structure, a first electrode and a second electrode. The bonding layer is disposed on one side of the permanent substrate. The geometric pattern layer is disposed on the bonding layer, wherein the geometric pattern layer has a periodic structure. The reflection layer is disposed between the bonding layer and the geometric pattern layer. The epitaxial structure is disposed on the geometric pattern layer, wherein the epitaxial structure comprises a first conductivity type semiconductor layer, an active layer and a second conductivity type semiconductor layer stacked in sequence, and the first conductivity type semiconductor layer and the second conductivity type semiconductor layer have different conductivity types. The first electrode is formed on the epitaxial structure. The second electrode is formed on another side of the permanent substrate.

According to another embodiment of the present invention, the method for manufacturing the light emitting diode comprises: providing a growth substrate; forming an epitaxial structure on the growth substrate, wherein the epitaxial structure comprises a first conductivity type semiconductor layer, an active layer, and a second conductivity type semiconductor layer stacked in sequence, wherein the first conductivity type semiconductor layer and the second conductivity type semiconductor layer are different conductivity types; forming a geometric pattern layer on the epitaxial structure, wherein the geometric pattern layer has a periodic structure; forming a reflection layer on the geometric pattern layer; forming a bonding layer on the reflection layer; forming a permanent substrate on the bonding layer; removing the growth substrate; forming a first electrode on the epitaxial structure; forming a second electrode on the permanent substrate.

According to an embodiment of the present invention, the light emitting diode comprises a permanent substrate, a bonding layer, a geometric pattern layer, a reflection layer, an epitaxial structure, a first electrode and a second electrode. The bonding layer is disposed on one side of the permanent substrate. The geometric pattern layer is disposed on the bonding layer, wherein the geometric pattern layer has a periodic structure. The reflection layer is disposed between the bonding layer and the geometric pattern layer. The epitaxial structure is disposed on the geometric pattern layer, wherein the epitaxial structure comprises a first conductivity type semiconductor layer, an active layer, and a second conductivity type semiconductor layer. The second conductivity type semiconductor layer with a portion surface exposed is disposed on the geometric pattern layer, and the active layer is disposed on the second conductivity type semiconductor layer. The first conductivity type semiconductor layer is disposed on the active layer, and the first conductivity type semiconductor layer and the second conductivity type semiconductor layer have different conductivity types. The first electrode is formed on the first conductivity type semiconductor layer. The second electrode is formed on the portion surface of the second conductivity type semiconductor layer.

According to another embodiment of the present invention, the method for manufacturing the light emitting diode comprises: providing a growth substrate; forming an epitaxial structure on the growth substrate, wherein the epitaxial structure comprises a first conductivity type semiconductor layer, an active layer and a second conductivity type semiconductor layer stacked in sequence, and the first conductivity type semiconductor layer and the second conductivity type semiconductor layer are different conductivity types; forming a geometric pattern layer on the epitaxial structure, wherein the geometric pattern layer has a periodic structure; forming a reflection layer on the geometric pattern layer; forming a bonding layer on the reflection layer; forming a permanent substrate on the bonding layer; removing the growth substrate; etching a portion of the first conductivity type semiconductor layer and a portion of the active layer to expose a portion surface of the second conductivity type semiconductor layer; forming a second electrode on the portion surface of the second conductivity type semiconductor layer; and forming a first electrode on the first conductivity type semiconductor layer.

Therefore, with the application of the light emitting diode disclosed in the embodiments of the present invention, the geometric pattern layer and the reflection layer thereof can form a reflective surface with the periodical structure to reflect the incident light emitted from the light emitting diode in different angles towards one side of the light emitting diode in a predetermined direction, thereby increasing the light extraction efficiency and the light emitting efficiency thereof.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
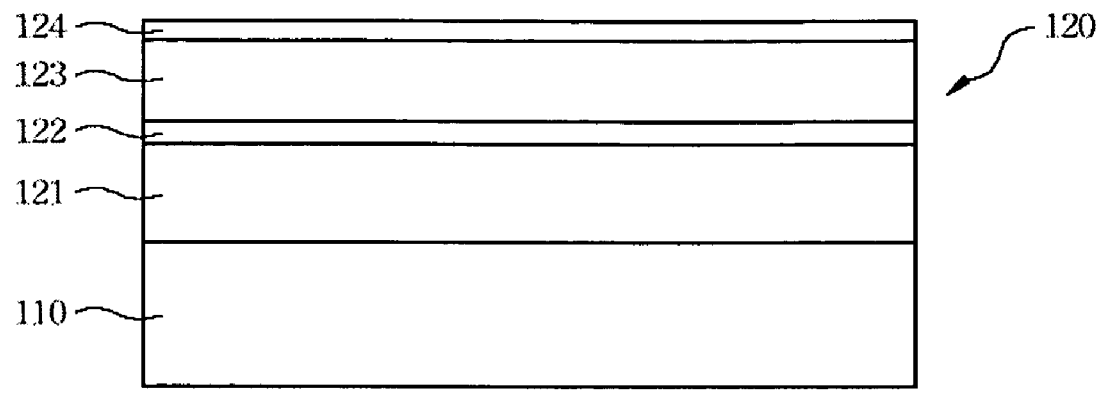
FIG. 1A through FIG. 1F are schematic flow diagrams showing the process for manufacturing a light emitting diode in accordance with a first embodiment of the present invention.

In order to make the illustration of the present invention more explicit and complete, the following description is stated with reference to FIG. 1A through FIG. 3B.

Refer to FIG. 1A through FIG. 1F. FIG. 1A through FIG. 1F are schematic flow diagrams showing the process for manufacturing a light emitting diode in accordance with a first embodiment of the present invention. The light emitting diode 100 of the first embodiment comprises an epitaxial structure 120, a geometric pattern layer 130, reflection layer 140, a bonding layer 150, a permanent substrate 160, a first electrode 170 and a second electrode 180. The bonding layer 150, reflection layer 140, geometric pattern layer 130 and epitaxial structure 120 are stacked on the permanent substrate 160 in sequence. The first electrode 170 and the second electrode 180 are respectively formed on both sides of the light emitting diode 100, thereby forming a vertical-conducting type structure.

Refer to FIG. 1A. First, the growth substrate 110 is provided, wherein the material thereof may be GaAs, Si, SiC, AlN, sapphire, hiP or GaP. Next, the epitaxial structure 120 is formed on the growth substrate 110. The epitaxial structure 120 is formed by an epitaxy method such as metal organic chemical vapor deposition (MOCVD), liquid phase epitaxy (LPE) or molecular beam epitaxy (MBE). The epitaxy structure 120 has a first conductivity type semiconductor layer 121, an active layer 122, a second conductivity type semiconductor layer 123 and a second conductivity type contact layer 124 stacked on the growth substrate 110 in sequence, wherein the first conductivity type semiconductor layer 121 and the second conductivity type semiconductor layer 123 are different conductivity types. In this embodiment, the first conductivity type and the second conductivity type are different conductivity types. That is, when the first conductivity type is p-type, the second conductivity type is n-type. Conversely, when the first conductivity type is n-type, the second conductivity type is p-type. In the present embodiment, the material of the first conductivity type semiconductor layer 121 is, for example, n-type $(Al_xGa_{1-x})_yIn_{1-y}P$, (x>0.4), and the active layer 122 may be preferably a multiple quantum well structure, which may be preferably composed of AlGaInP, and the material of the second conductivity type semiconductor layer 123 is, for example, p-type $(Al_xGa_{1-x})_yIn_{1-y}P$, (x>0.4), and the material of the second conductivity type contact layer 124 is preferably conductive and transparent, such as Indium Tin Oxide, Indium Oxide, Tin Oxide, Cadmium Tin Oxide, Zinc oxide, Magnesium oxide or Titanium Nitride. Further, in various embodiments of the present invention, the epitaxial structure 120 comprises a homo-structure, a single hetero-structure, a double hetero-structure, a multiple quantum well, or any arbitrary combination thereof.

Figure 1B:
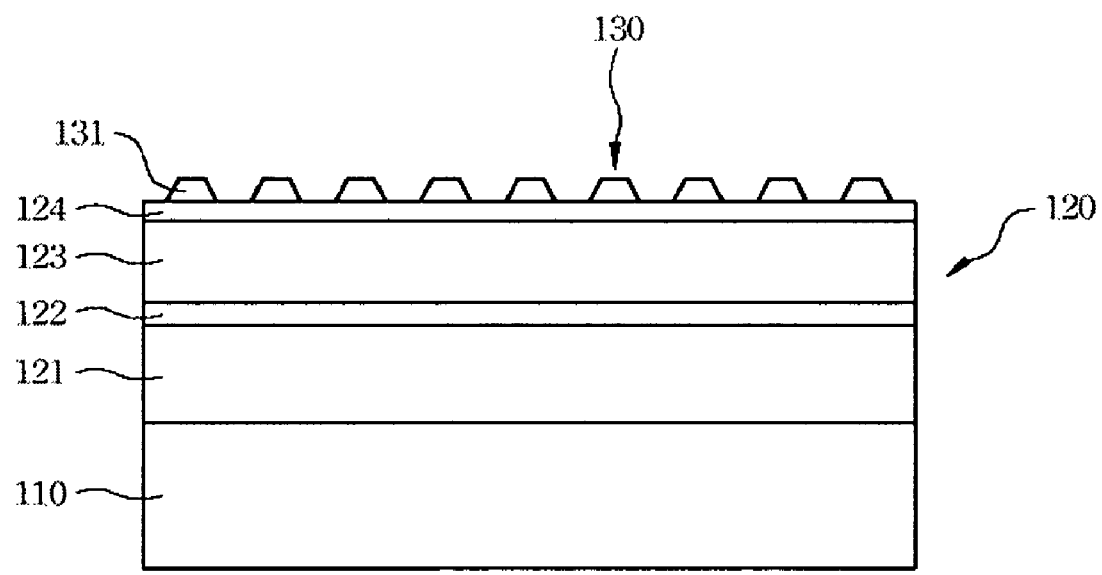
Figure 2:
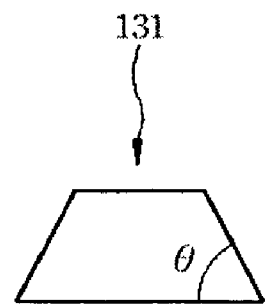
FIG. 2 is a side view showing a trapezoid-shaped structure of a light emitting diode in accordance with a first embodiment of the present invention.

Refer to FIG. 1B and FIG. 2. FIG. 2 is a cross-sectional view showing a trapezoid-shaped structure of a light emitting diode in accordance with a first embodiment of the present invention. Next, the geometric pattern layer 130 is formed on the epitaxial structure 120, wherein the geometric pattern layer 130 has a periodical structure, which is preferably composed of a plurality of trapezoid-shaped structures 131. The geometric pattern layer 130 may be dielectric or transparent material, such as $SiO_x$, $SiN_x$, $TiO_x$, or $AlO_x$, formed on the epitaxial structure 120. The trapezoid-shaped structures 131 are respectively disposed with a predetermined interval, thereby forming the periodical structure. The base angle of each of the trapezoid-shaped structures 131 is substantially less than 90 degrees.

Figure 1C:
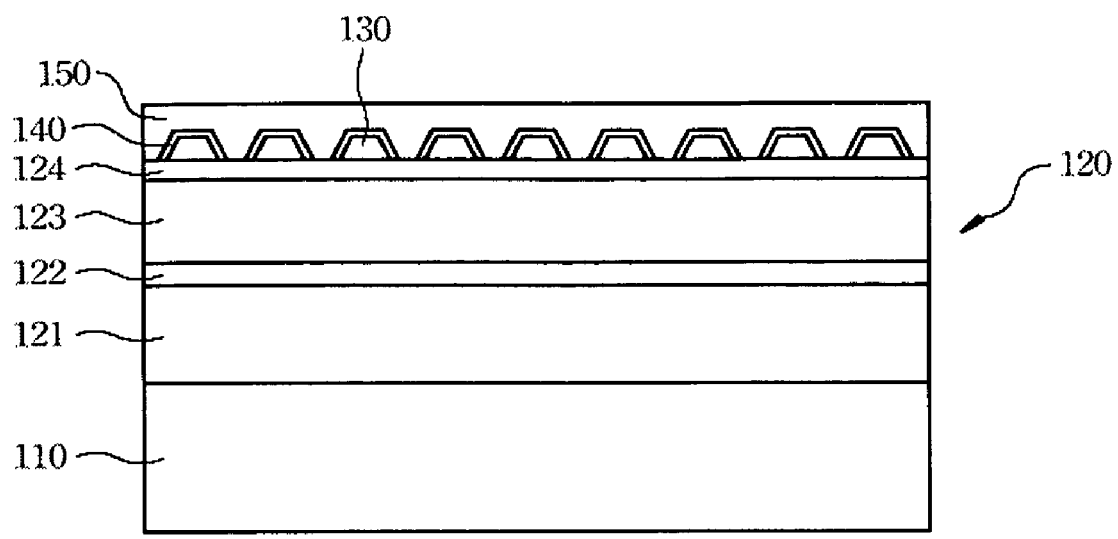

Refer to FIG. 1C. The reflection layer 140 is formed on the geometric pattern layer 130. Then, the bonding layer 150 is formed on the reflection layer 140. The material of the reflection layer 140 may be high reflectivity metal, such as Al, Au, Pt, Zn, Ag, Ni, Ge, In, Sn, or alloys thereof. The material of bonding layer may be silver paste, spontaneous conductive polymer, or polymer doped with conductive materials (such as Al, Au, Pt, Zn, Ag, Ni, Ge, In, Sn, Ti, Pb, Cu, Pd or alloys thereof) for bonding to the permanent substrate 160 in a substrate transferring process. It is worth mentioning that the reflection layer 140 can form a reflective surface with a periodical structure to reflect the incident light in different angle because the reflection layer 140 is formed conformally on the geometric pattern layer 130.

Figure 1D:
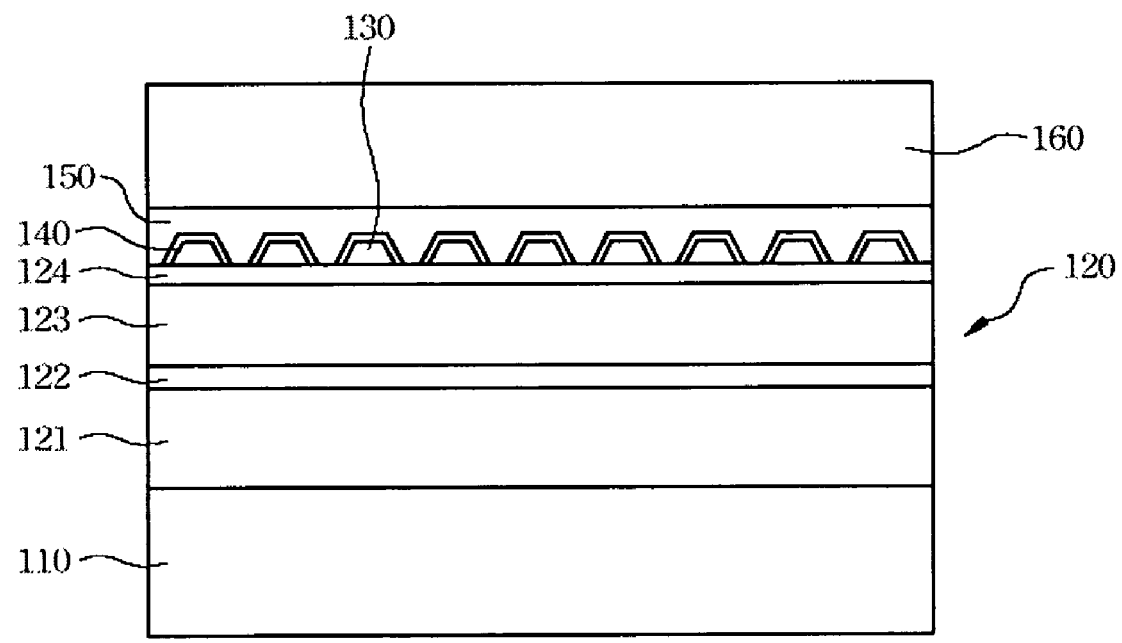

Refer to FIG. 1D. The permanent substrate 160 is formed on the bonding layer 150. The material of the permanent substrate 160 of the present embodiment is electrically conductive, which may be GaAsP, AlGaInP, AlGaAs, GaP Si or metal.

Figure 1E:
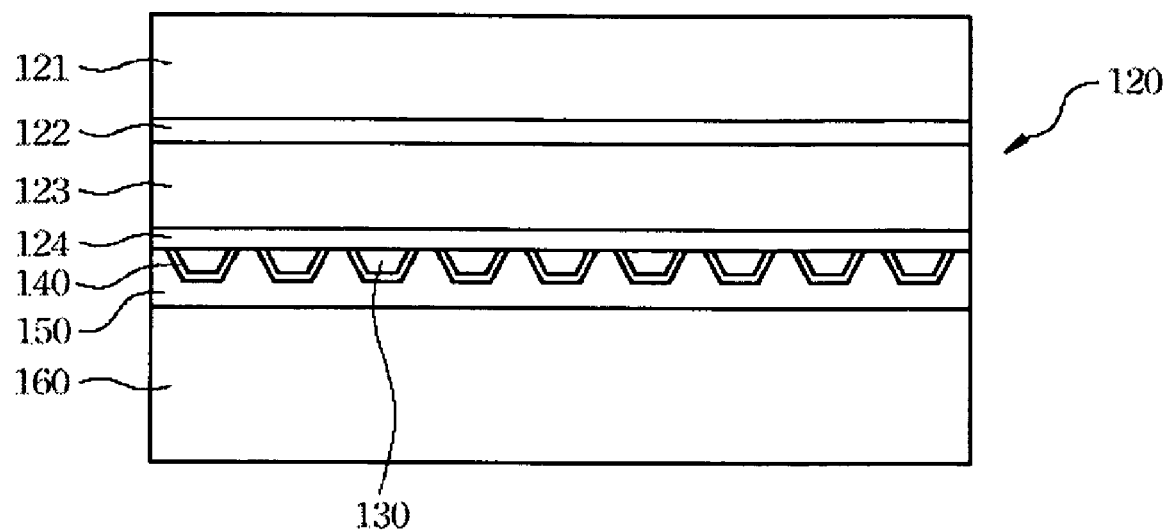

Refer to FIG. 1E. The growth substrate 110 is removed, so as to expose a portion surface of the first conductivity type semiconductor layer 121 of the epitaxial structure 120. The growth substrate 110 is removed by, for example, a laser lift-off process, an etch process, or a chemical mechanical polishing process.

Figure 1F:
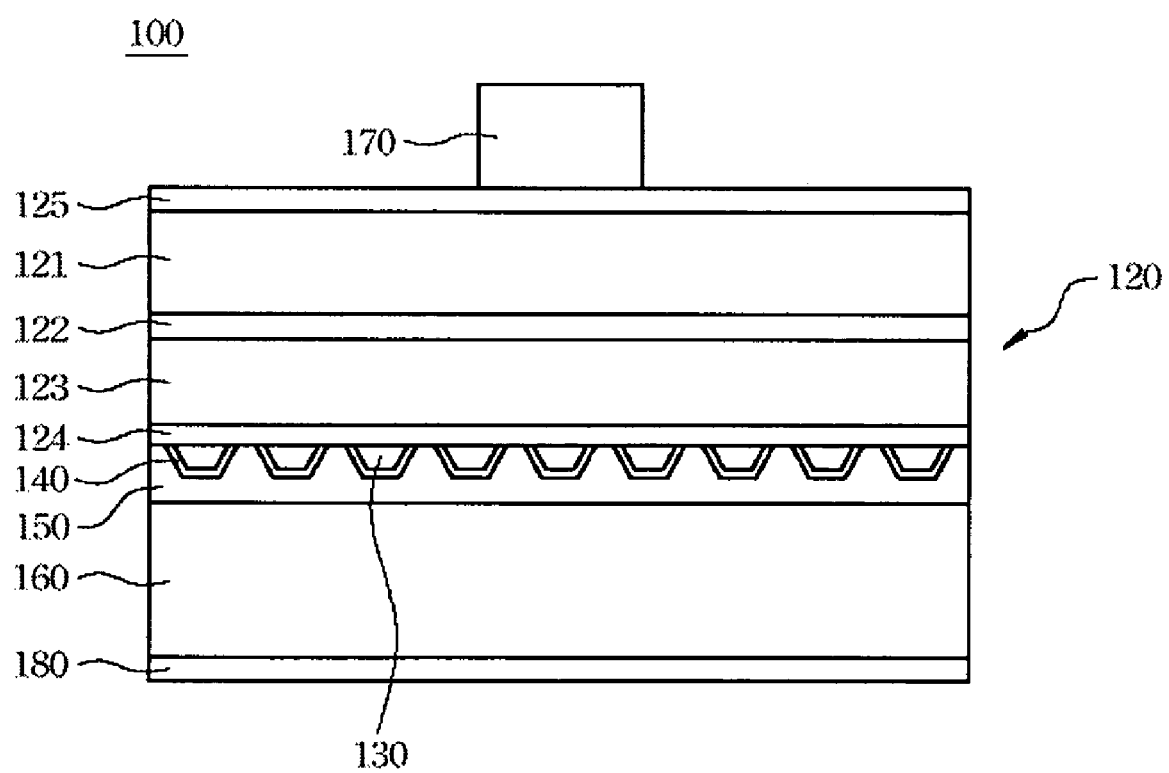

Refer to FIG. 1F. A first conductivity type contact layer 125 is formed on the first conductivity type semiconductor layer 121 of the epitaxial structure 120. The material of the first conductivity type contact layer 125 is preferably conductive and transparent, such as Indium Tin Oxide, Indium Oxide, Tin Oxide, Cadmium Tin Oxide, Zinc oxide, Magnesium oxide or Titanium Nitride. Then, the first electrode 170 is formed on the first conductivity type semiconductor layer 125, and the second electrode 180 is formed on the portion surface of the permanent substrate 160, thereby achieving the light-emitting diode 100 of the present embodiment. The material of the first electrode 170 may be In, Al, Ti, Au, W, InSn, TiN, Wsi, PtIn$_2$, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, Au/Ni/Ti/Si/Ti, or alloys thereof. The material of the second electrode 180 may be Ni/Au, NiO/Au, Pd/Ag/Au/Ti/Au, Pt/Ru, Ti/Pt/Au, Pd/Ni, Ni/Pd/Au, Pt/Ni/Au, Ru/Au, Nb/Au, Co/Au, Pt/Ni/Au, Ni/Pt, Niun, Pt$_3$In$_7$, or alloys thereof.

Therefore, the light emitting diode 100 of the present embodiment can use the geometric pattern layer 130 and the reflection layer 140 to form a reflective surface with the periodical structure, thereby reflecting the incident light emitted from the light emitting diode 100 in a different angle towards one side of the light emitting diode 100 in a predetermined direction, and increase the light extraction efficiency and the light emitting efficiency.

Figure 3A:
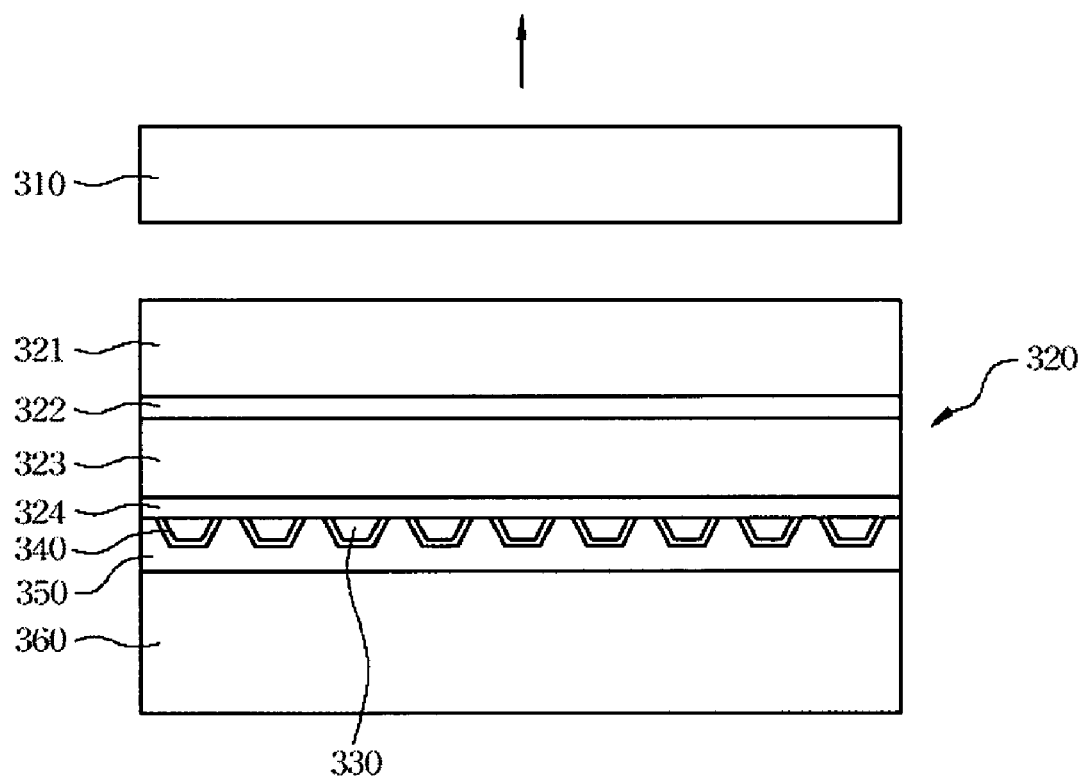
FIG. 3A and FIG. 3B are schematic flow diagrams showing the process for manufacturing a light emitting diode in accordance with a second embodiment of the present invention.
Figure 3B:
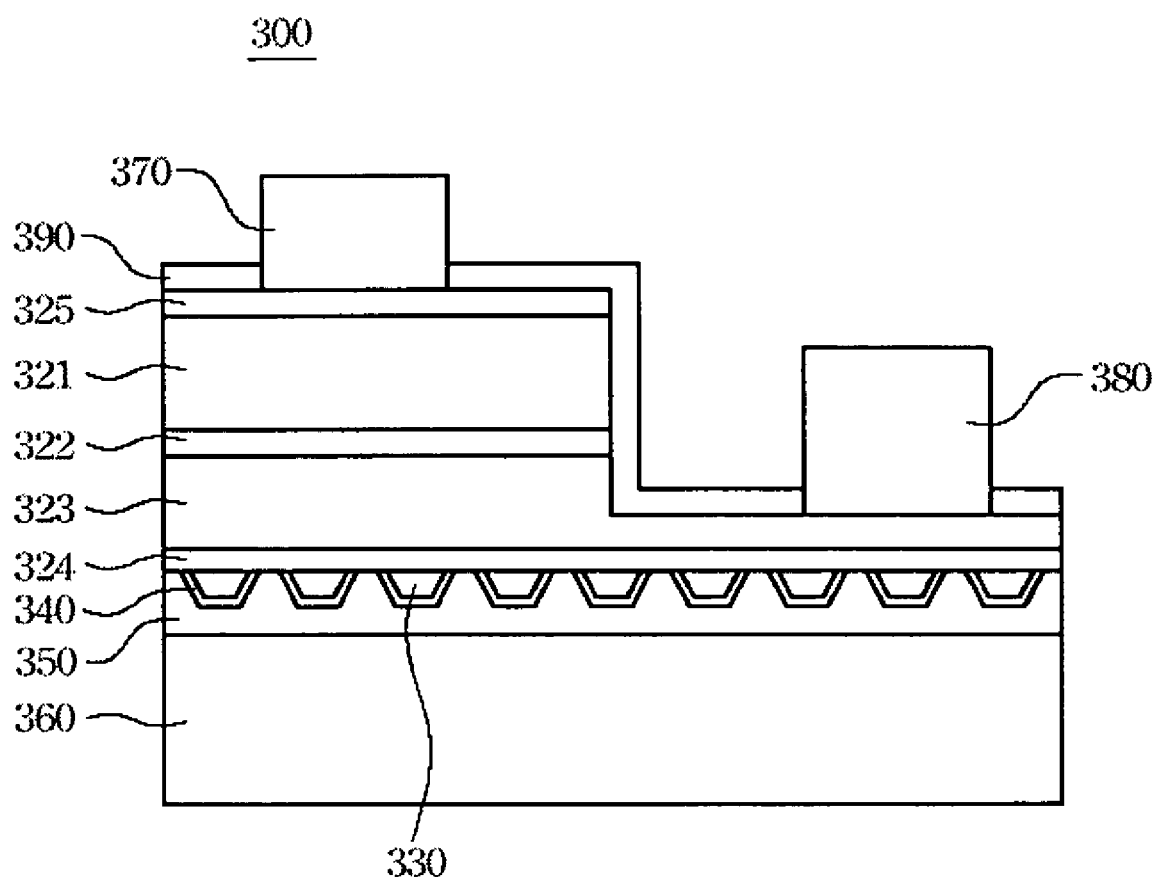

Refer to FIG. 3A and FIG. 3B. FIG. 3A and FIG. 3B are schematic flow diagrams showing the process for manufacturing a light emitting diode in accordance with a second embodiment of the present invention. Some reference numerals shown in FIG. 1E and FIG. 1F are used in the second embodiment of the present invention. The construction of the light emitting diode shown in the second embodiment is similar to that in the first embodiment with respect to configuration and function, and thus is not stated in detail herein.

Refer again to FIG. 3A and FIG. 3B, in comparison with the first embodiment, the light emitting diode 300 of the second embodiment comprises an epitaxial structure 320, a geometric pattern layer 330, a reflection layer 340, a bonding layer 350, a permanent substrate 360, a first electrode 370, a second electrode 380 and an insulating layer 390. The bonding layer 350, reflection layer 340, geometric pattern layer 330 and epitaxial structure 320 are stacked on the permanent substrate 360 in sequence, wherein the epitaxial structure 320 has a first conductivity type semiconductor layer 321, an active layer 322, a second conductivity type semiconductor layer 323, a second conductivity type contact layer 324, and a first conductivity type contact layer 325. The second conductivity type semiconductor layer 323 has a portion surface exposed. The first electrode 370 is formed on the first conductivity type contact layer 325, and the second electrode 380 is formed on the portion exposing surface of the second conductivity type semiconductor layer 323, thereby forming a lateral-conducting type structure. It is worth mentioning that the permanent substrate 360 can be either electrically conductive or not.

Refer to FIG. 3A and FIG. 3B. After removing the growth substrate 310 and forming the first conductivity type contact layer 325, a portion of the first conductivity type semiconductor layer 321 and a portion of the active layer 322 is etched by, for example, a dry etch process, a wet etch process, or a chemical mechanical polishing process to expose a portion surface of the second conductivity type semiconductor layer 323. Next, the first electrode 370 is formed on the first conductivity type contact layer 325, and the second electrode 380 is formed on the portion surface of the second conductivity type semiconductor layer 323, thereby forming the lateral-conducting type structure. Next, the insulating layer 390 is formed on the exposing surface of the first conductivity type contact layer 325 and the second conductivity type semiconductor layer 323 to package and protect the light emitting diode 300 of the present embodiment. The material of the insulating layer 390 may be silicon containing oxide, nitride or high dielectric organic material. Therefore, the light emitting diode 300 of the present embodiment can use the geometric pattern layer 330 and the reflection layer 340 to increase the light extraction efficiency and the light emitting efficiency thereof.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light emitting diode, comprises:
   a permanent substrate;
   a bonding layer disposed on one side of the permanent substrate;
   a geometric pattern layer disposed on the bonding layer, wherein the geometric pattern layer has a plurality of reversed trapezoid-shaped structures;
   a reflection layer disposed between the bonding layer and the geometric pattern layer;
   an epitaxial structure disposed on the geometric pattern layer, wherein the epitaxial structure comprises a first conductivity type semiconductor layer, an active layer and a second conductivity type semiconductor layer, and the first conductivity type semiconductor layer and the second conductivity type semiconductor layer are different conductivity types wherein the bonding layer is in direct and physical contact with the reflection layer and the epitaxial structure.

2. The light emitting diode as claimed in claim 1, further comprising a first electrode formed on the epitaxial structure and a second electrode formed on another side of the permanent substrate; wherein the epitaxial structure further comprises a first conductivity type contact layer and a second conductivity type contact layer, wherein the first conductivity type contact layer is disposed between the first electrode and the first conductivity type semiconductor layer, and the second conductivity type contact layer is disposed between the geometric pattern layer and the second conductivity type semiconductor layer.

3. The light emitting diode as claimed in claim 1, wherein the reflection layer has a plurality of reversed trapezoid-shaped structures.

4. he light emitting diode as claimed in claim 1, wherein the permanent substrate is electrically conductive, and the material of the permanent substrate is selected from a group consisting of GaAsP, AlGaInP, AlGaAs, GaP, Si and metal.

5. The light emitting diode as claimed in claim 1, wherein the material of the geometric pattern layer is selected from a group consisting of SiOx, SiNx, TiOx and AlOx.

6. The light emitting diode as claimed in claim 1, wherein the material of the bonding layer is selected from a group consisting of silver paste, spontaneous conductive polymer or polymer incorporated with conductive material.

* * * * *